US012787563B2

(12) United States Patent
Zhang et al.

(10) Patent No.: US 12,787,563 B2
(45) Date of Patent: Nov. 3, 2026

(54) DISPLAY PANEL WITH IMPROVED SURFACE FLATNESS, MANUFACTURING METHOD THEREOF, AND DISPLAY DEVICE

(71) Applicant: Shenzhen China Star Optoelectronics Semiconductor Display Technology Co., Ltd., Shenzhen (CN)

(72) Inventors: Lei Zhang, Shenzhen (CN); Shijian Qin, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 682 days.

(21) Appl. No.: 18/194,114

(22) Filed: Mar. 31, 2023

(65) Prior Publication Data

US 2024/0215336 A1 Jun. 27, 2024

(30) Foreign Application Priority Data

Dec. 27, 2022 (CN) ........................ 202211691002.0

(51) Int. Cl.
*H10K 59/124* (2023.01)
*H10K 59/12* (2023.01)

(52) U.S. Cl.
CPC ....... *H10K 59/124* (2023.02); *H10K 59/1201* (2023.02)

(58) Field of Classification Search
CPC ........................ H10K 59/124; H10K 59/1201
USPC ........................................................... 257/72
See application file for complete search history.

(56) References Cited

U.S. PATENT DOCUMENTS

2023/0006025 A1* 1/2023 Lee ........................ H10K 50/86

FOREIGN PATENT DOCUMENTS

| | | | |
|---|---|---|---|
| CN | 106531768 | A | 3/2017 |
| CN | 109166896 | A | 1/2019 |
| CN | 110718572 | A | 1/2020 |
| CN | 111129040 | A | 5/2020 |

OTHER PUBLICATIONS

Chinese Office Action issued in corresponding Chinese Patent Application No. 202211691002.0 dated Nov. 30, 2025, pp. 1-6.

* cited by examiner

*Primary Examiner* — Xia L Cross
(74) *Attorney, Agent, or Firm* — PV IP PC; Christopher S. Ruprecht; Wei Te Chung

(57) ABSTRACT

The present invention provides a display panel and a manufacturing method thereof, and a display device. The display panel includes a light emitting device layer and an array substrate. The array substrate includes a substrate layer, an insulation module, a first conductive layer and a second conductive layer. The insulation module is disposed on the substrate layer. The first conductive layer and the second conductive layer are disposed in the insulation module at different layers. The first conductive layer includes pad layers, and orthographic projections of the pad layers and the second conductive layer on the substrate layer are not overlapped. Alternatively, first grooves are provided on a surface of the substrate layer facing the conductive structure, and orthographic projections of the first grooves and the second conductive layer on the substrate layer are overlapped.

13 Claims, 6 Drawing Sheets

DISPLAY PANEL WITH IMPROVED SURFACE FLATNESS, MANUFACTURING METHOD THEREOF, AND DISPLAY DEVICE

CROSS REFERENCE TO RELATED APPLICATION

This application claims priority to China Patent Application No. 202211691002.0, filed on Dec. 27, 2022, which is incorporated herein by reference in its entirety.

TECHNICAL FIELD

The present invention relates to display technologies, and more particularly to a display panel, a manufacturing method thereof, and a display device.

BACKGROUND

At present, in the design of organic light emitting diode (OLED) display panels, because a metal wiring layer located under a light emitting area is patterned, there are level difference and uneven height on the pixel electrode layer. This makes an organic light emitting device on the pixel electrode layer have non-uniform thickness, resulting in non-uniform luminance of the device. This greatly reduces the luminous efficiency of the light emitting device.

SUMMARY

The objective of the present invention is to provide a display panel and a manufacturing method thereof, and a display device, for solving the technical problems in the prior art such as non-uniform light emission and low luminous efficiency caused when an organic light emitting device has uneven thickness.

To achieve above objective, the present invention provides a display panel, which includes a light emitting device layer and an array substrate. The light emitting device layer are provided with a plurality of light emitting devices, and the light emitting device layer is disposed on the array substrate.

The array substrate includes a substrate layer, an insulation module, a first conductive layer and a second conductive layer. The insulation module is disposed on the substrate layer. The first conductive layer and the second conductive layer are disposed in the insulation module at different layers, and the first conductive layer is located at a side of the second conductive layer close to the substrate layer.

The first conductive layer includes pad layers, and orthographic projections of the pad layers and the second conductive layer on the substrate layer are not overlapped. Alternatively, first grooves are provided on a surface of the substrate layer facing the conductive structure, and orthographic projections of the first grooves and the second conductive layer on the substrate layer are overlapped.

Further, the substrate layer includes a base layer, a light shielding layer and a buffer layer. The light shielding layer is disposed on the base layer. The buffer layer is disposed on the base layer and covers the light shielding layer. The first grooves are provided on a surface of the buffer layer away from the light shielding layer. An active layer in the array substrate is disposed in the first grooves.

Further, the depth of the first groove is less than or equal to the thickness of the active layer.

Further, the second conductive layer includes a first electrode layer, a second electrode layer and a wiring layer.

The second electrode layer is located at a side of the first electrode layer. The wiring layer is located at a side of the second electrode layer away from the first electrode layer. The first electrode layer, the second electrode layer and the wiring layer are located on the same plane in the insulation module and are electrically insulated from each other; The orthographic projections of the pad layers on the substrate layer are located at two sides of the wiring layer.

Further, the insulation module includes a gate insulating layer, an interlayer dielectric layer, a passivation layer and a flat layer. The gate insulating layer is disposed on the substrate layer, and the first conductive layer is disposed on a surface of the gate insulating layer away from the active layer. The interlayer dielectric layer is disposed on the substrate layer and covering the gate insulating layer and the first conductive layer, and the second conductive layer is disposed at a side of the interlayer dielectric layer away from the first conductive layer. The passivation layer is disposed on the interlayer dielectric layer and covers the second conductive layer. The flat layer is disposed on the passivation layer.

Second grooves are provided on a surface of the interlayer dielectric layer facing the second conductive layer, and the second conductive layer is located in the second grooves.

Further, the gate insulating layer includes a first insulating layer and a second insulating layer. The first insulating layer is disposed on a surface of the active layer of the array substrate away from the substrate layer. The second insulating layer is disposed on the substrate layer and corresponds to the wiring layer in the second conductive layer.

The pad layers are disposed on a surface of the second insulating layer away from the substrate layer, or the second insulating layer is disposed in one of the first grooves. The first conductive layer further includes a gate layer, and the gate layer is disposed on a surface of the first insulating layer away from the active layer.

The present invention further provides a method for manufacturing a display panel, including steps of: preparing a substrate layer; manufacturing a first conductive layer, a second conductive layer and an insulation module on the substrate layer to form an array substrate; manufacturing a plurality of light emitting devices on the array substrate to form a light emitting device layer.

After preparing the substrate layer, the method further including steps of: forming first grooves on the substrate layer, wherein orthographic projections of the first grooves and the second conductive layer on the substrate layer are overlapped; or forming pad layers when the first conductive layer is manufactured, wherein orthographic projections of the pad layers and the second conductive layer on the substrate layer are not overlapped.

Further, the step of preparing the substrate layer includes: forming a light shielding layer on a base layer;

forming a buffer layer covering the light shielding layer on the base layer; forming the first grooves on a surface of the buffer layer away from the light shielding layer.

After the step of preparing the substrate layer, the method further includes: forming an active layer in the first grooves.

Further, the step of manufacturing the first conductive layer, the second conductive layer and the insulation module on the substrate layer includes: forming a gate insulating layer on the substrate layer; forming the first conductive layer on the gate insulating layer; forming an interlayer dielectric layer covering the gate insulating layer and the first conductive layer on the substrate layer; forming the second conductive layer on the interlayer dielectric layer;

forming a passivation layer covering the second conductive layer on the interlayer dielectric layer; forming a flat layer on the passivation layer.

After the step of forming the interlayer dielectric layer on the substrate layer, the method further includes: forming second grooves on a surface of the interlayer dielectric layer facing the second conductive layer, and forming the second conductive layer in the second grooves.

The present invention further provides a display device, including the display panel as described above.

The advantages of the present invention are described below. In the display panel and the manufacturing method thereof in accordance with the present invention, the surface flatness of the array substrate can be improved by adding film layers to raise the height of a concave part in the array substrate or by reducing the thickness of protrusions of film layers. The problem of uneven surface height of the light emitting device caused by the uneven surface of the array substrate can be addressed, thereby improving the luminous efficiency of the light-emitting device and increasing the display brightness of the display panel.

BRIEF DESCRIPTION OF THE DRAWINGS

For explaining the technical solutions used in the embodiments of the present invention more clearly, the appended figures to be used in describing the embodiments will be briefly introduced in the following. Obviously, the appended figures described below are only some of the embodiments of the present invention, and those of ordinary skill in the art can further obtain other figures according to these figures without making any inventive effort.

Figure 1:
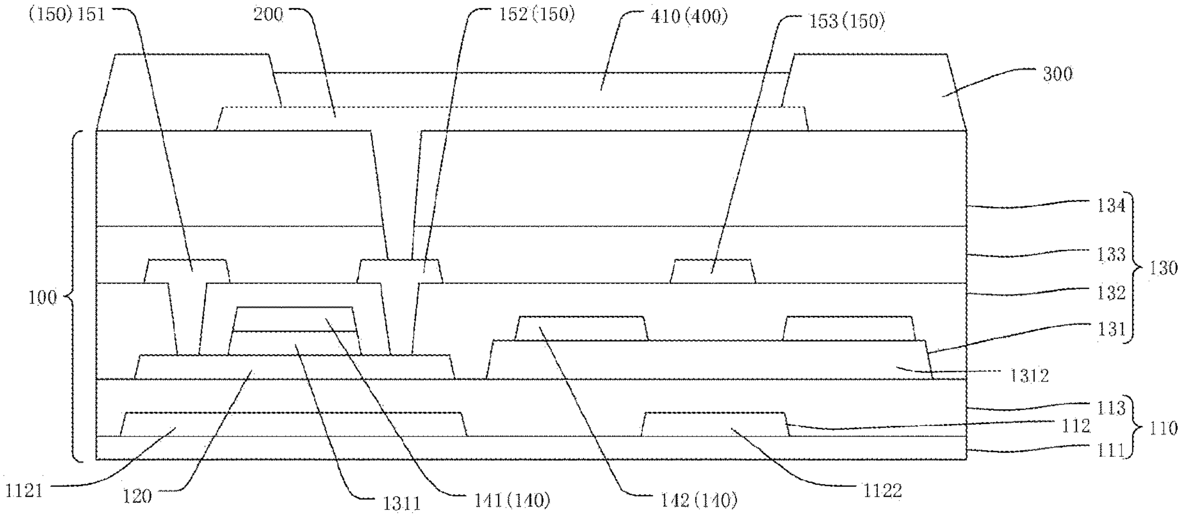
FIG. 1 is a schematic diagram illustrating a layered structure of a display panel in Embodiment 1 of the present invention.

The components shown in the figures are labeled as follows:

| | |
|---|---|
| display panel 10; | array substrate 100; |
| substrate layer 110; | base layer 111; |
| light shielding layer 112; | first light shielding layer 1121; |
| second light shielding layer 1122; | buffer layer 113; |
| first groove 1131; | active layer 120; |
| insulation module 130; | gate insulating layer 131; |
| first insulating layer 1311; | second insulating layer 1312; |
| interlayer dielectric layer 132; | first connecting hole 1321; |
| second groove 1322; | passivation layer 133; |
| flat layer 134; | second connecting hole 135; |
| first conductive layer 140; | gate layer 141; |
| pad layer 142; | second conductive layer 150; |
| first electrode layer 151; | second electrode layer 152; |
| wiring layer 153; | pixel electrode layer 200; |
| pixel defining layer 300; | light emitting device layer 400; |
| light emitting device 410. | |

DETAILED DESCRIPTION

Preferred embodiments of the present disclosure will be introduced with reference to appended drawings as follows to demonstrate that the present disclosure may be implemented. The embodiment of the present disclosure can be fully introduced to those skilled in the art to make technical contents more clear and easy to understand. The present disclosure can be embodied in many different forms of embodiment, and the scope of protection of the present disclosure is not limited to the embodiments set forth herein.

In the accompanying drawings, structurally identical components are designated by the same reference numerals, and structurally or functionally similar components throughout are designated by similar numerical reference numerals. The dimensions and thicknesses of each component shown in the drawings are arbitrarily shown. The size and thickness of each component are not limited, and for the sake of clarity, the thickness of the components is exaggerated somewhat in some places in the drawings.

Furthermore, the following descriptions of the various embodiments are made with reference to the accompanying drawings for illustrating, in an exemplary way, specific embodiments to which the present disclosure is applicable. Directional terminology, such as "up", "down", "front", "rear", "left", "right", "internal", "external", and "side", used in the present disclosure are described according to the direction shown in the drawings and are not intended to indicate or suggest a designated device or component must be of a specific direction or be constructed or operated in a specific direction and thus they should not be construed as constraint to the scope of the present disclosure. In addition, terms such as "first", "second", and "third" are used herein for purposes of description and are not intended to indicate or imply relative importance.

When a component is described to be "on" the other component, the component may be directly disposed on the other component; alternatively, an intervening component may exist, the component is disposed on the intervening component, and the intervening component is disposed on the other component. When a component is described to be "installed on" or "connected to" the other component, it may be understood that the component is directly "installed" or "connected" to each other, alternatively it is understood that one component is "installed" or "connected" to the other component through an intervening component.

Embodiment 1

An embodiment of the present invention provides a display device, which may be an organic light emitting diode (OLED) display device. The display device includes a display panel 10, and the display panel 10 is used to provide displayed images for the display device. The display device can be any display unit with a display function, such as a mobile phone, a notebook computer, a tablet computer, and the like.

As shown in FIG. 1, the display panel 10 includes an array substrate 100 and a light emitting device layer 400.

The array substrate 100 includes a substrate layer 110, an insulation module 130, an active layer 120, a first conductive layer 140 and a second conductive layer 150. The insulation module 130 includes a gate insulating layer 131, an interlayer dielectric layer 132, a passivation layer 133 and a flat layer 134.

The substrate layer 110 includes a base layer 111, a light shielding layer 112 and a buffer layer 113.

The base layer 111 is an insulating base layer 111, which can be a hard glass plate, a quartz plate, or a flexible polyimide film layer. When the base layer 111 is a flexible film layer, the display panel 10 can realize flexible and bendable display.

The light shielding layer 112 is disposed on a surface of the base layer 111 and has a first light shielding layer 1121 and a second light shielding layer 1122. The first light shielding layer 1121 corresponds to the active layer 120, and the first light shielding layer 1121 overlaps with the orthographic projection of the active layer 120 on the substrate layer 110. The second light shielding layer corresponds to a wiring layer 153 of the second conductive layer 150, and the second light shielding layer 1122 overlaps with the orthographic projection of the wiring layer 153 on the substrate layer 110. The light shielding layer 112 is made of one or more metal materials and is used to reflect external light incident from a side of the base layer 111 to prevent the external light from affecting the operation of the active layer 120.

The buffer layer 113 is disposed on the base layer 111 and covers the exposed surface of the light shielding layer 112. The buffer layer 113 is made of an insulating inorganic material and is used to insulate and protect the light shielding layer 112 and the active layer 120. The buffer layer 113 can also buffer and protect the structure of the display panel 10 to reduce the damage caused by the impact during transportation and meanwhile isolate the intrusion of water and oxygen from the outside.

The active layer 120 is disposed on a surface of the buffer layer 113 away from the light shielding layer 112 and can be made of semiconductor materials such as low-temperature polysilicon and metal oxide.

The gate insulating layer 131 is disposed on the substrate layer 110 and includes a first insulating layer 1311 and a second insulating layer 1312. The first insulating layer 1311 is disposed on a surface of the active layer 120 away from the buffer layer 113, and its width is smaller than that of the active layer 120 to expose two ends of the active layer 120. The second insulating layer 1312 is disposed on the substrate layer 110 and corresponds to the second light shielding layer 1122, that is, also corresponding to the wiring layer 153 in the second conductive layer 150. Also, the width of the second insulating layer 1312 is greater than the width of the second light shielding layer 1122 and the width of the wiring layer 153, that is, the second insulating layer 1312 overlaps with the orthographic projections of the second light shielding layer 1122 and the wiring layer 153 on the substrate layer 110. Preferably, the thickness of the second insulating layer 1312 is equal to the sum of the thicknesses of the active layer 120 and the thickness of the first insulating layer 1311 such that the top surface of the second insulating layer 1312 away from of the substrate layer 110 and the top surface of the first insulating layer 1311 away from the substrate layer 110 are located on the same plane. This reduces the level difference between the first insulating layer 1311 and the second insulating layer 1312.

The first conductive layer 140 includes a gate layer 141 and at least two pad layers 142. The gate layer 141 is disposed on a surface of the first insulating layer 1311 away from the active layer 120. The pad layer 142 is disposed on a surface of the second insulating layer 1312 away from the buffer layer 113, and the two pad layers 142 are located at two ends of the second insulating layer 1312, respectively.

The interlayer dielectric layer 132 is disposed on the buffer layer 113 and covers exposed surfaces of the active layer 120, the gate insulating layer 131 and the first conductive layer 140.

The second conductive layer 150 is disposed on a surface of the interlayer dielectric layer 132 away from the buffer layer 113 and includes a first electrode layer 151, a second electrode layer 152 and the wiring layer 153. The first electrode layer 151 and the second electrode layer 152 are located at two ends of the active layer 120, respectively, and each of the bottom surfaces of the first electrode layer 151 and the second electrode layer 152 has a connecting portion. The connecting portions are electrically connected to the active layer 120 via the interlayer dielectric layer 132, respectively. The wiring layer 153 is located at a side of the second electrode layer 152 away from the first electrode layer 151 and corresponds to the second insulating layer 1312 and the second light shielding layer 1122.

Specifically, the insulation module 130 generally uses insulating inorganic materials, such as silicon oxide, silicon nitride, and the like. The first conductive layer 140 and the second conductive layer 150 are made of metal materials with excellent electrical conductivity.

When the gate layer 141 is fed with an electric current and voltage, it will generate an electric field. The electric field will cause the surface of the active layer 120 to generate induced charges to change the width of a channel in the active layer 120, thereby achieving the purpose of controlling the current of the first electrode layer 151 and the second electrode layer 152 and realizing the driving of each light emitting device 410 in the display panel 10.

The light emitting device layer 400 is disposed on the flat layer 134 and has a plurality of light emitting devices 410. As shown in FIG. 1, the light emitting device 410 is electrically connected to the second electrode layer 152 in the array substrate 100 via a pixel electrode layer 200. Specifically, the pixel electrode layer 200 is disposed on a surface of the flat layer 134 away from the passivation layer 133, and its bottom surface also has a connecting portion. The connecting portion of the pixel electrode layer 200 is electrically connected to and contacts the upper surface of the second electrode layer 152 by sequentially passing through the flat layer 134 and the passivation layer 133.

The display panel 10 further includes a pixel defining layer 300 disposed on the flat layer 134 and the pixel electrode layer 200. There are a plurality of openings in the pixel defining layer 300. The openings penetrate the pixel defining layer 300 and correspond to the pixel electrode layer 200 such that the upper surface of the pixel defining layer 300 is exposed. A light emitting device 410 is disposed in each of the openings, and the light emitting device 410 is electrically connected to the pixel electrode layer 200 in the opening.

The orthographic projection of the pixel electrode layer 200 on the substrate layer 110 overlaps with the orthographic projections of the first conductive layer 140 and the second conductive layer 150 on the substrate layer 110. Since there are a plurality of conductive structures in the conductive layer 150, this makes the surface of the array substrate 100 uneven. This also makes the height of the surfaces of the pixel electrode layer 200 and the light emitting device 410 disposed on the array substrate 100 uneven.

Further, the orthographic projection of the wiring layer 153 on the substrate layer 110 does not overlap with the orthographic projections of the pad layers 142 on the substrate layer 110, the orthographic projections of the two pad layers 142 are located at a side of the orthographic projection of the wiring layer 153 away from the orthographic projection of the second 152, and the orthographic projection of the wiring layer 153 is located between the orthographic projections of the pad layers 142. In this way, the pad layers correspond to gaps between two adjacent conductive structures in the second conductive layer 150, and this increases the total film thickness of the array substrate 100 at the gaps of the second conductive layer 150, thereby reducing the level difference caused by patterning the conductive structures in the second conductive layer 150. The level difference between the second conductive layer 150 and the interlayer dielectric layer 132 can be reduced to less than 200 nanometers, thereby improving non-uniform luminescence caused by inconsistent height of film layer surface of the light emitting device 410 due to the level difference and improving the luminous efficiency of the light emitting device 410.

Figure 2:
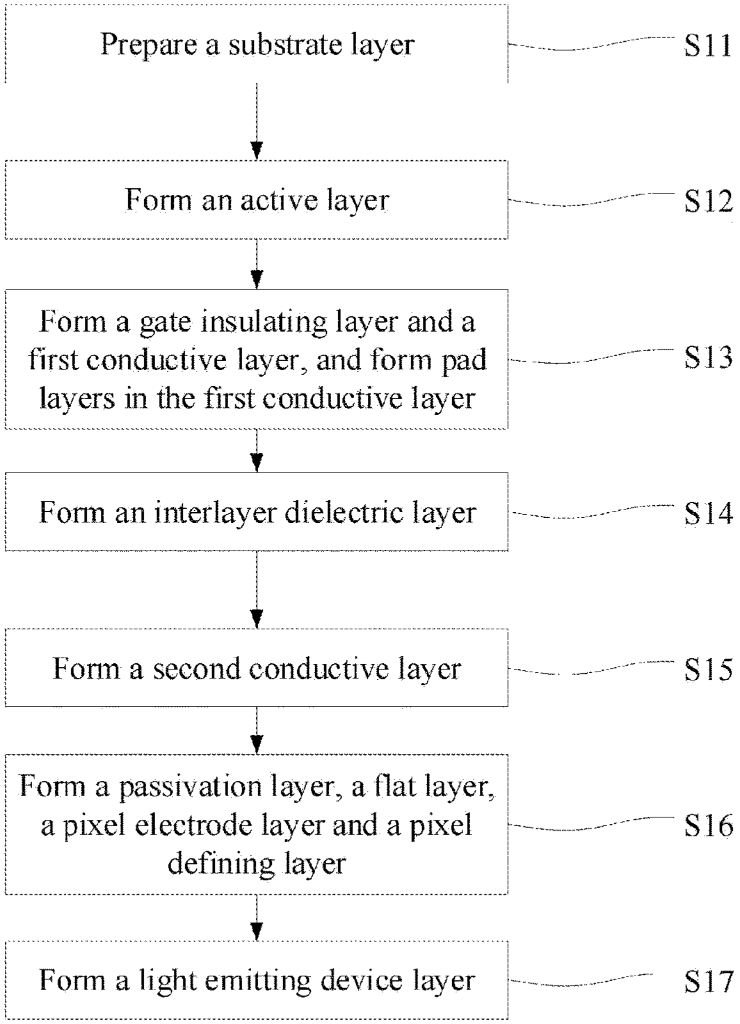
FIG. 2 is a schematic flowchart of a method for manufacturing a display panel in Embodiment 1 of the present invention.

An embodiment of the present invention also provides a method for manufacturing a display panel 10. This method is used to manufacture the display panel 10 as described above. The manufacturing process of this method is shown in FIG. 2, which includes Steps S11-S17.

Step S11) Prepare a Substrate Layer 110:

A metal material layer of metal molybdenum or metal copper is deposited on a glass base layer 111 by physical vapor sputtering. The material of a diffusion barrier layer may be a material having a work function similar to that of copper, such as molybdenum-titanium alloy, molybdenum and tantalum.

Figure 3:
FIG. 3 is a schematic diagram illustrating a layered structure after forming a light shielding layer in Step S10 in Embodiment 1 of the present invention.

The metal material layer is patterned by a photolithography process to form a first light shielding layer 1121 and a second light shielding layer 1122 as shown in FIG. 3.

Further, a diffusion barrier layer and an etching barrier layer can be deposited on the metal material layer by physical vapor sputtering. The material of the etching barrier layer may be metal oxides such as indium tin oxide, indium gallium zinc oxide, and the like. The light shielding layer 112 and the diffusion barrier layer can use hydrogen peroxide-based chemical solution as an etchant for the patterning, and the etching barrier layer can use oxalic acid-based chemical solution as an etchant for the patterning.

Figure 4:
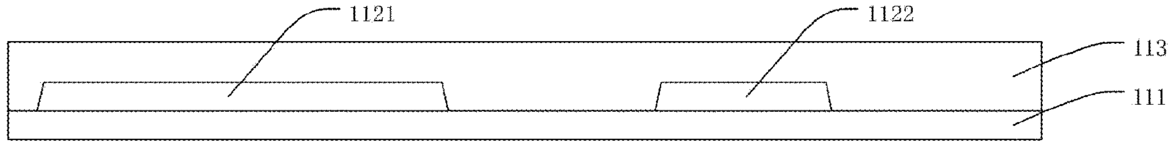
FIG. 4 is a schematic diagram illustrating a layered structure after forming a buffer layer in Step S10 in Embodiment 1 of the present invention.

A layer of inorganic material is deposited on the base layer 111 by chemical vapor deposition to form a buffer layer 113 as shown in FIG. 4.

The base layer 111, the first light shielding layer 1121, the second light shielding layer 1122 and the buffer layer 113 are combined to form the substrate layer 110.

Figure 5:
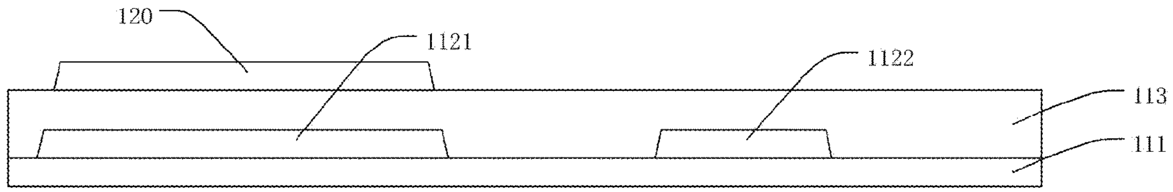
FIG. 5 is a schematic diagram illustrating a layered structure after forming an active layer in Step S20 in Embodiment 1 of the present invention.

Step S12) Form an Active Layer 120:

A layer of semiconductor material is deposited by physical vapor sputtering, and the semiconductor material may be metal oxides such as indium tin oxide and indium gallium zinc oxide. The semiconductor material layer is patterned by a photolithography process to form an active layer 120 as shown in FIG. 5. The active layer 120 may use oxalic acid-based chemical solution as an etchant for the patterning.

Figure 6:
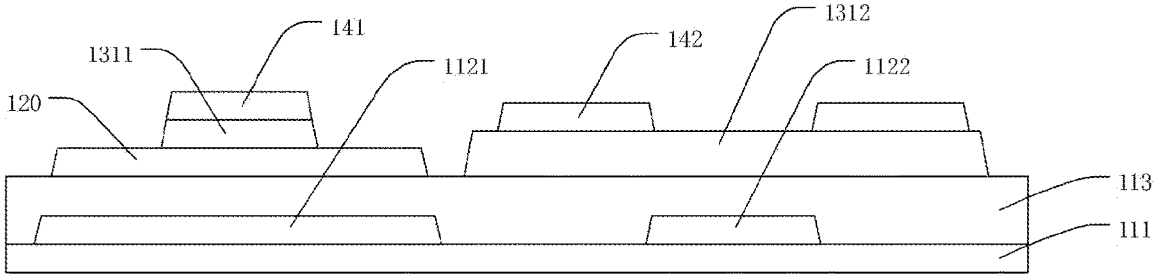
FIG. 6 is a schematic diagram illustrating a layered structure after forming an gate insulating layer and a first conductive layer in Step S30 in Embodiment 1 of the present invention.

Step S13) Form a Gate Insulating Layer 131 and a First Conductive Layer 140, and Form Pad Layers 142 in the First Conductive Layer 140:

A layer of inorganic material covering the active layer 120 is deposited on the substrate layer 110 by chemical vapor deposition, and a layer of metal material is deposited on a surface of the inorganic material layer away from the active layer 120. The inorganic material layer and the metal material layer are patterned by a photolithography process. As shown in FIG. 6. a first insulating layer 1311 and a second insulating layer 1312 in the gate insulating layer 131 are formed as well as in the first conductive layer 140, a gate layer 141 located on the first insulating layer 1311 and pad layers 142 located on the second insulating layer 1312 are formed. During the patterning of the gate layer 141, the active layer 120 is conductorized by plasma treatment after the photoresist of the gate layer 141 is peeled off.

Figure 7:
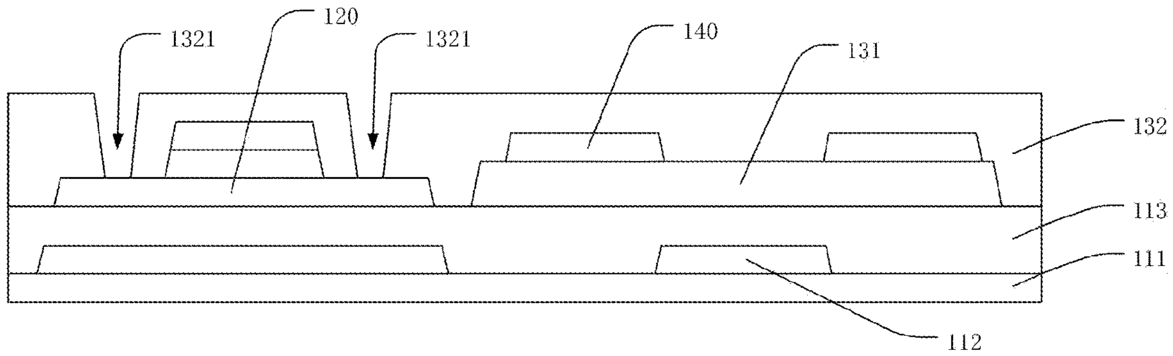
FIG. 7 is a schematic diagram illustrating a layered structure after forming an interlayer dielectric layer in Step S40 in Embodiment 1 of the present invention.

Step S14) Form an Interlayer Dielectric Layer 132:

A layer of inorganic material is deposited on the substrate layer 110 by chemical vapor deposition to form an interlayer dielectric layer 132. The interlayer dielectric layer 132 is patterned by a photolithography process to form first connecting holes 1321 penetrating the interlayer dielectric layer 132 and located at two ends of the active layer 120, as shown in FIG. 7. The interlayer dielectric layer 132 may be dry-etched using an oxidizing gas such as fluorine.

Figure 8:
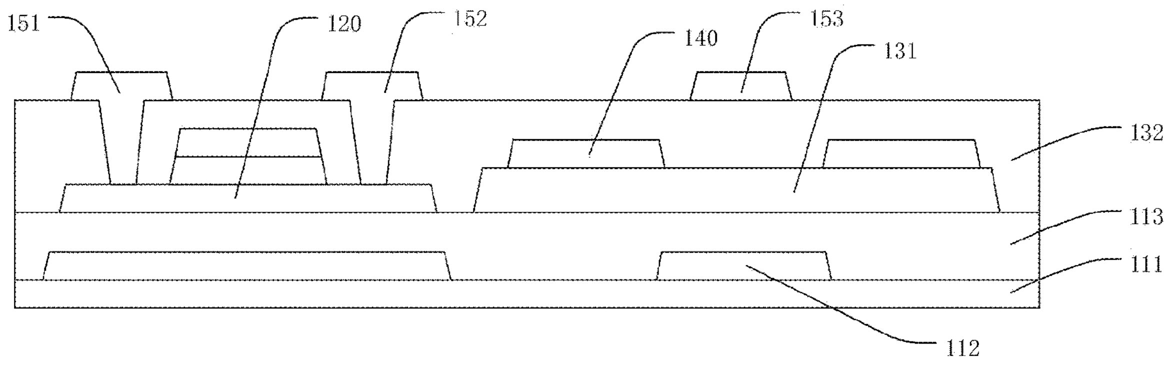
FIG. 8 is a schematic diagram illustrating a layered structure after forming a second conductive layer in Step S50 in Embodiment 1 of the present invention.

Step S15) Form a Second Conductive Layer 150:

A metal material layer filling up the first connecting holes 1321 is deposited on the interlayer dielectric layer 132 by physical vapor deposition, and the metal material layer is a laminated structure of a molybdenum-titanium alloy layer and a copper metal layer. The metal material layer is patterned by a photolithography process. As shown in FIG. 8, a first electrode layer 151, a second electrode layer 152 and a wiring layer 153 are formed in the second conductive layer 150. The second conductive layer 150 can be etched by using hydrogen peroxide-based chemical solution as an etchant for the patterning.

Further, in Step S14, the buffer layer 113 can be patterned by using photolithography process again to form deep holes sequentially penetrating the interlayer dielectric layer 132 and the buffer layer 113, and in Step S15, the metal material is also deposited in the deep holes such that the first electrode layer 151 or the second electrode layer 152 can be electrically connected to the light shielding layer 112, thereby avoiding a floating gate effect caused by the light shielding layer 112.

Furthermore, when a dry etching barrier layer on the light shielding layer 112 is InGaZnO, dry etching plasma should also be used to conductorize the etching barrier layer to ensure charge transferring between the first electrode layer 151 in the second conductive layer 150 and the light shielding layer 112, thereby compensating the threshold voltage (Vth).

Step S16) Form a Passivation Layer 133, a Flat Layer 134, a Pixel Electrode Layer 200 and a Pixel Defining Layer 300:

A passivation layer 133 and a flat layer 134 are formed on the interlayer dielectric layer 132 by deposition. The passivation layer 133 and the flat layer 134 are patterned to form a second connecting hole 135 penetrating the flat layer 134 and the passivation layer 133.

A conductive material is deposited on the flat layer 134 to fill the second connecting hole 135, and the layer of conductive material is patterned to form the pixel electrode layer 200.

Figure 9:
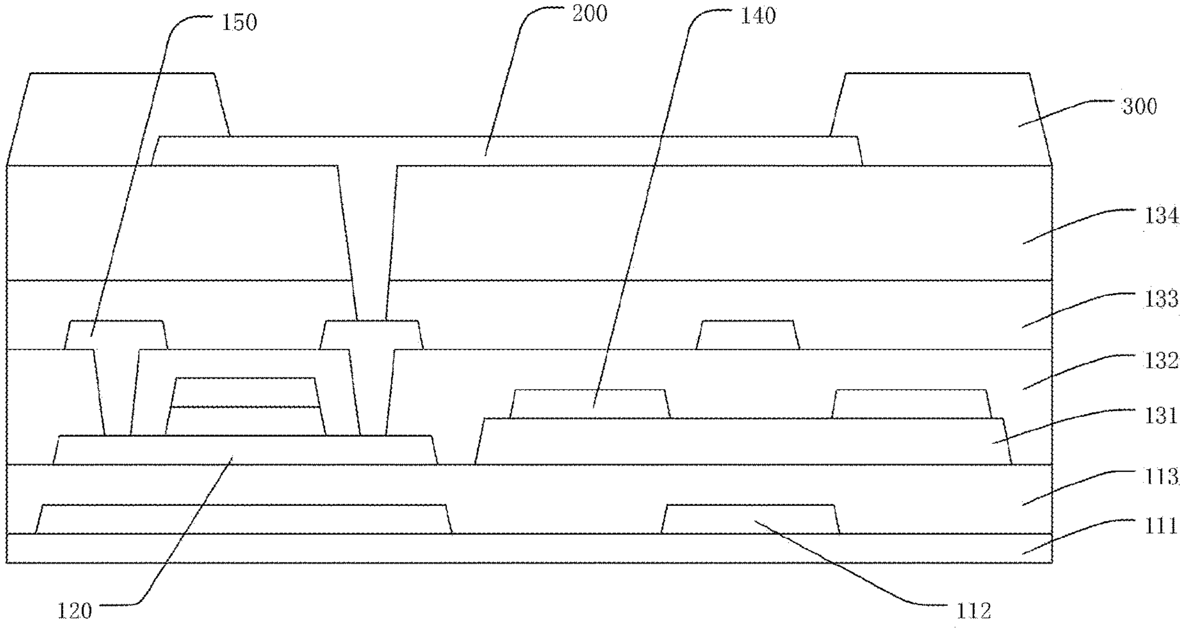
FIG. 9 is a schematic diagram illustrating a layered structure after forming a pixel defining layer in Step S60 in Embodiment 1 of the present invention.

A layer of insulating material is coated on the flat layer 134 and the pixel electrode layer 200 and is patterned to form a pixel defining layer 300 having a plurality of openings, as shown in FIG. 9.

Step S17) Form a Light Emitting Device Layer 400:

Organic material layers, such as a hole injection layer, a hole transport layer and a light emitting layer, are printed in the openings by ink jet printing, and an electron transport layer and an electron injection layer are formed on the light emitting layer by evaporation. Finally, a cathode layer is formed by a sputtering process. The hole injection layer, the hole transport layer, the light emitting layer, the electron transport layer and the electron injection layer are combined to form a light emitting device 410 in the light emitting device layer 400.

In the embodiment of the present invention, by deploying the pad layers, the thickness of film layers between two adjacent conductive structures in the second conductive layer is increased, thereby making compensation for the level difference between the interlayer dielectric layer and the patterned conductive structures in the second conductive layer. In this way, surface flatness of the array substrate is improved, thereby improving the flatness of the pixel electrode layer manufactured on the surface of the array substrate. Further, the height of the surface of the light emitting device on the pixel electrode layer can also be maintained uniform such that the light emitted by the light emitting device becomes more uniform, thereby improving the luminous efficiency of the light emitting device.

Moreover, the embodiment of the present invention is a preferred embodiment. The pad layers can be manufactured at the same time as the gate layer in the array substrate and can share the same mask with the gate layer. The number of process steps will not increase, neither the number of masks. It will not affect the order of production, and the manufacturing efficiency will not be affected.

Further, the display panel provided in the embodiment of the present invention is tested on luminous efficiency in comparison to counterpart examples of display panel with high level difference, and related data are obtained as shown in Table 1.

TABLE 1

| | Counterpart example 1 | Counterpart example 2 | The embodiment of the present invention |
|---|---|---|---|
| Level difference before the flattening process | 1.1-1.7 microns | 0.5-1.1 microns | 0.1-0.7 microns |
| Level difference peak after the flattening process | 0.3-0.45 microns | 0.2-0.3 microns | 0-0.2 microns |
| Luminous flux of green light emitting devices for a flexible substrate | 31 cd/A | 43 cd/A | 52 cd/A |
| Luminous flux of green light emitting devices for a glass substrate | 51 cd/A | 54 cd/A | 60 cd/A |

It can be seen from the above table that the luminous efficiency of green light emitting devices in the embodiment of the present invention for a flexible substrate increases by 67.7% compared to the counterpart example 1 and increases by 20.9% compared to the counterpart example 2. The luminous efficiency of green light emitting devices in the embodiment of the present invention for a glass substrate increases by 17.6% compared to the counterpart example 1 and increases by 11.1% compared to the counterpart example 2. Therefore, compared with the display panels in the existing counterpart example 1 and counterpart example 2, the luminous efficiency of the display panel in the embodiment of the present invention is greatly improved.

Embodiment 2

Figure 10:
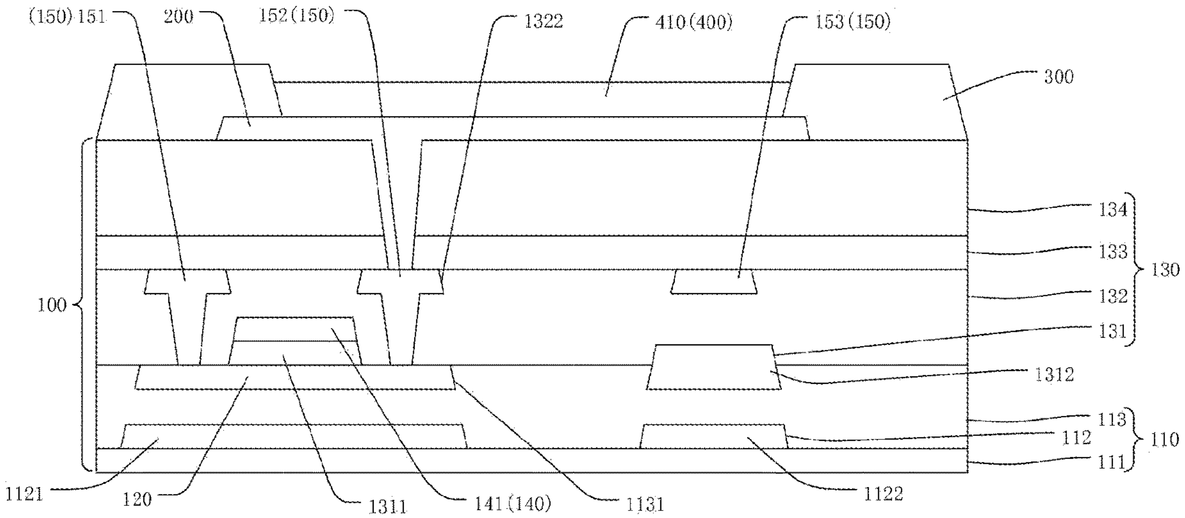
FIG. 10 is a schematic diagram illustrating a layered structure of a display panel in Embodiment 2 of the present invention.

An embodiment of the present invention provides a display panel 10. As shown in FIG. 10, the display panel 10 includes an array substrate 100 and a light emitting device layer 400.

The array substrate 100 includes a substrate layer 110, an insulation module 130, an active layer 120, a first conductive layer 140 and a second conductive layer 150. The insulation module 130 includes a gate insulating layer 131, an interlayer dielectric layer 132, a passivation layer 133 and a flat layer 134.

The substrate layer 110 includes a base layer 111, a light shielding layer 112 and a buffer layer 113.

The base layer 111 is an insulating base layer 111, which can be a hard glass plate, a quartz plate, or a flexible polyimide film layer. When the base layer 111 is a flexible film layer, the display panel 10 can realize flexible and bendable display.

The light shielding layer 112 is disposed on a surface of the base layer 111 and has a first light shielding layer 1121 and a second light shielding layer 1122. The first light shielding layer 1121 corresponds to the active layer 120, and the first light shielding layer 1121 overlaps with the orthographic projection of the active layer 120 on the substrate layer 110. The second light shielding layer corresponds to a wiring layer 153 of the second conductive layer 150, and the second light shielding layer 1122 overlaps with the orthographic projection of the wiring layer 153 on the substrate layer 110. The light shielding layer 112 is made of one or more metal materials and is used to reflect external light incident from a side of the base layer 111 to prevent the external light from affecting the operation of the active layer 120.

The buffer layer 113 is disposed on the base layer 111 and covers the exposed surface of the light shielding layer 112. The buffer layer 113 is made of an insulating inorganic material and is used to insulate and protect the light shielding layer 112 and the active layer 120. The buffer layer 113 can also buffer and protect the structure of the display panel 10 to reduce the damage caused by the impact during transportation and meanwhile isolate the intrusion of water and oxygen from the outside.

At least two first grooves 1131 are provided on a surface of the buffer layer 113 away from the light shielding layer 112, and the two first grooves 1131 correspond to the first light shielding layer 1121 and the second light shielding layer 1122, respectively. The width of the first groove 1131 corresponding to the first light shielding layer 1121 is less than the width of the first light shielding layer 1121, and the width of the first groove 1131 corresponding to the second light shielding layer 1122 is less than the width of the second light shielding layer 1122.

The active layer 120 is filled into the first groove 1131 corresponding to the first light shielding layer 1121 and can be made of semiconductor materials such as low-temperature polysilicon and metal oxide. The depth of the first groove 1131 is less than or equal to the thickness of the active layer 120. Preferably, the depth of the first groove 1131 is equal to the thickness of the active layer 120 such that a surface of the active layer 120 away from the light shielding layer 112 and a surface of the buffer layer 113 away from the light shielding layer 112 are located on the same plane. This can minimize the height of the second conductive layer 150 in the array substrate 100 without affecting the electrically connecting structure of the active layer, thereby reducing the level difference between film layers.

The gate insulating layer 131 is disposed on the substrate layer 110 and includes a first insulating layer 1311 and a second insulating layer 1312. The first insulating layer 1311 is disposed on a surface of the active layer 120 away from the buffer layer 113, and its width is smaller than that of the active layer 120 to expose two ends of the active layer 120. The second insulating layer 1312 is disposed in the other one of the first grooves 1131 and corresponds to the second light shielding layer 1122, that is, also corresponding to the second insulating layer 1312 and the wiring layer 153 in the second conductive layer 150. Preferably, the thickness of the second insulating layer 1312 is equal to the sum of the thicknesses of the active layer 120 and the thickness of the first insulating layer 1311 such that the top surface of the second insulating layer 1312 away from of the substrate layer 110 and the top surface of the first insulating layer 1311 away from the substrate layer 110 are located on the same plane. This reduces the level difference between the first insulating layer 1311 and the second insulating layer 1312.

The first conductive layer 140 is disposed on a surface of the first insulating layer 1311 away from the active layer 120. The first conductive layer 140 serves as a gate layer 141 in the array substrate 100 and changes the electrical conductive state of the active layer 120 by an electric field.

The interlayer dielectric layer 132 is disposed on the buffer layer 113 and covers exposed surfaces of the active layer 120, the gate insulating layer 131 and the first conductive layer 140. A plurality of second grooves 1322 are disposed on a surface of the interlayer dielectric layer 132 away from the buffer layer 113.

The second conductive layer 150 is disposed on a surface of the interlayer dielectric layer 132 away from the buffer layer 113 and includes a first electrode layer 151, a second electrode layer 152 and the wiring layer 153. The first electrode layer 151 and the second electrode layer 152 are located at two ends of the active layer 120 respectively, and are located in the second grooves 1322 respectively. Each of the bottom surfaces of the first electrode layer 151 and the second electrode layer 152 has a connecting portion, and the connecting portion is electrically connected to the active layer 120 via the interlayer dielectric layer 132. The wiring layer 153 is located at a side of the second electrode layer 152 away from the first electrode layer 151 and corresponds to the second insulating layer 1312 and the second light shielding layer 1122. The wiring layer 153 is located in one of the second grooves 1322.

The depth of the second grooves 1322 is less than or equal to the thickness of the second conductive layer 150. Preferably, the depth of the second grooves 1322 is equal to the thickness of the second conductive layer 150 such that a surface of the second conductive layer 150 away from the substrate layer 110 and a surface of the interlayer dielectric layer 132 away from the substrate layer 110 are located in the same plane, thereby further eliminating the level difference between the interlayer dielectric layer 132 and the conductive structures in the second conductive layer 150.

The insulation module 130 generally uses insulating inorganic materials, such as silicon oxide, silicon nitride, and the like. The first conductive layer 140 and the second conductive layer 150 are made of metal materials with excellent electrical conductivity.

When the gate layer 141 is fed with an electric current and voltage, it will generate an electric field. The electric field will cause the surface of the active layer 120 to generate induced charges to change the width of a channel in the active layer 120, thereby achieving the purpose of controlling the current of the first electrode layer 151 and the second electrode layer 152 and realizing the driving of each light emitting device 410 in the display panel 10.

The light emitting device layer 400 is disposed on the flat layer 134 and has a plurality of light emitting devices 410. As shown in FIG. 10, the light emitting device 410 is electrically connected to the second electrode layer 152 in the array substrate 100 via a pixel electrode layer 200. Specifically, the pixel electrode layer 200 is disposed on a surface of the flat layer 134 away from the passivation layer 133, and its bottom surface also has a connecting portion. The connecting portion of the pixel electrode layer 200 is electrically connected to and contacts the upper surface of the second electrode layer 152 by sequentially passing through the flat layer 134 and the passivation layer 133.

The display panel 10 further includes a pixel defining layer 300 disposed on the flat layer 134 and the pixel electrode layer 200. There are a plurality of openings in the pixel defining layer 300. The openings penetrate the pixel defining layer 300 and correspond to the pixel electrode layer 200 such that the upper surface of the pixel defining layer 300 is exposed. A light emitting device 410 is disposed in each of the openings, and the light emitting device 410 is electrically connected to the pixel electrode layer 200 in the opening.

The orthographic projection of the pixel electrode layer 200 on the substrate layer 110 overlaps with the orthographic projections of the first conductive layer 140 and the second conductive layer 150 on the substrate layer 110. Since there are a plurality of conductive structures in the conductive layer 150, this makes the surface of the array substrate 100 uneven. This also makes the height of the surfaces of the pixel electrode layer 200 and the light emitting device 410 disposed on the array substrate 100 uneven.

Further, the orthographic projections of the first grooves 1131 on the substrate layer 110 overlap with the orthographic projection of the second conductive layer 150 on the substrate layer 110 such that the film thickness of the protrusions caused by the second conductive layer 150 in the array substrate 100 is reduced by the first grooves 1131, thereby improving the surface flatness of the array substrate 100. Meanwhile, the second grooves 1322 are used to embed each conductive structure in the second conductive layer 150 into the interlayer dielectric layer 132, thereby reducing the level difference between the second conductive layer 150 and the interlayer dielectric layer 132. The level difference between the second conductive layer 150 and the interlayer dielectric layer 132 can be reduced to less than 200 nanometers, thereby further enhancing the flatness of the surface of the array substrate 100 and further improving non-uniform luminescence caused by inconsistent height of film layer surface of the light emitting device 410 due to the level difference and improving the luminous efficiency of the light emitting device 410.

Figure 11:
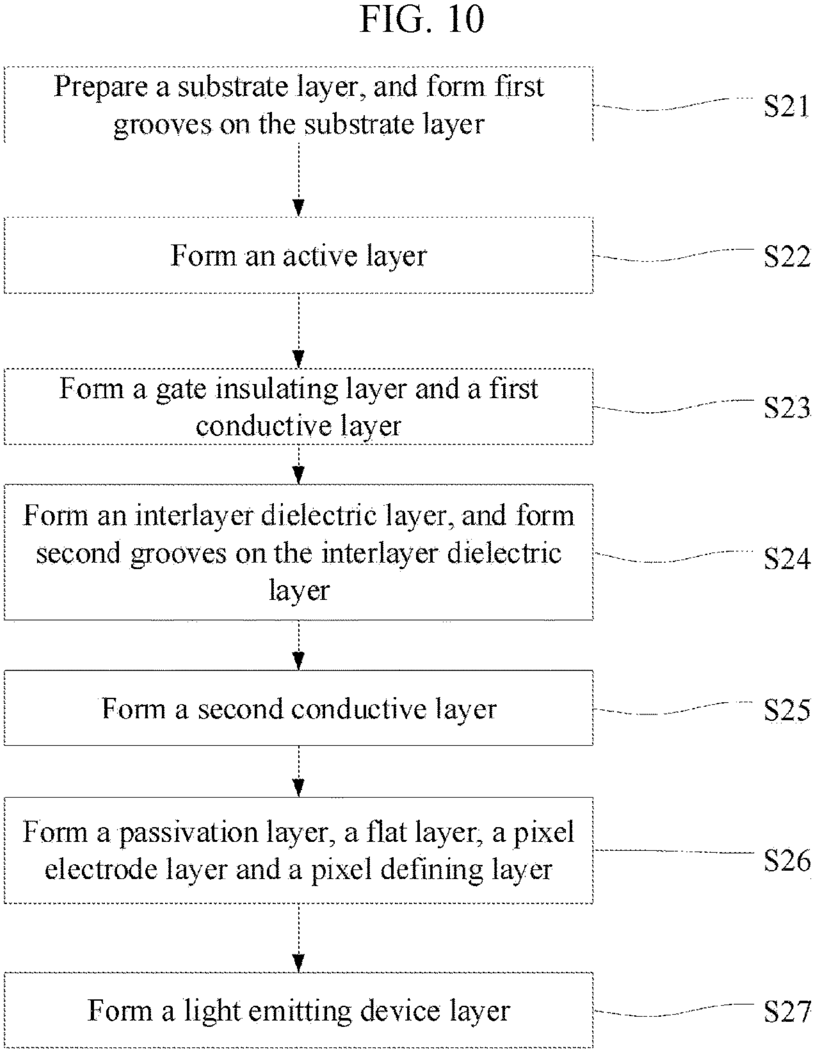
FIG. 11 is a schematic flowchart of a method for manufacturing a display panel in Embodiment 2 of the present invention.

An embodiment of the present invention also provides a method for manufacturing a display panel 10. This method is used to manufacture the display panel 10 as described above. The manufacturing process of this method is shown in FIG. 11, which includes Steps S21-S27.

Step S21) Prepare a Substrate Layer 110, and Form First Grooves 1131 on the Substrate Layer 110:

A metal material layer of metal molybdenum or metal copper is deposited on a glass base layer 111 by physical vapor sputtering. The material of a diffusion barrier layer may be a material having a work function similar to that of copper, such as molybdenum-titanium alloy, molybdenum and tantalum.

Figure 12:
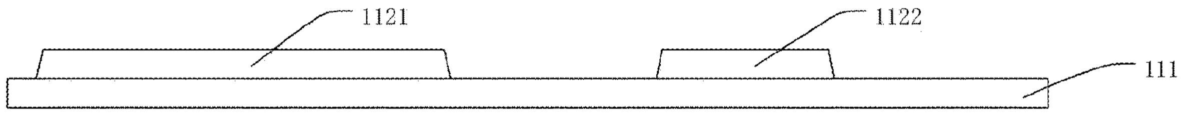
FIG. 12 is a schematic diagram illustrating a layered structure after forming a light shielding layer in Step S10 in Embodiment 2 of the present invention.

The metal material layer is patterned by a photolithography process to form a first light shielding layer 1121 and a second light shielding layer 1122 as shown in FIG. 12.

Further, a diffusion barrier layer and an etching barrier layer can be deposited on the metal material layer by physical vapor sputtering. The material of the etching barrier layer may be metal oxides such as indium tin oxide, indium gallium zinc oxide, and the like. The light shielding layer 112 and the diffusion barrier layer can use hydrogen peroxide-based chemical solution as an etchant for the patterning, and the etching barrier layer can use oxalic acid-based chemical solution as an etchant for the patterning.

Figure 13:
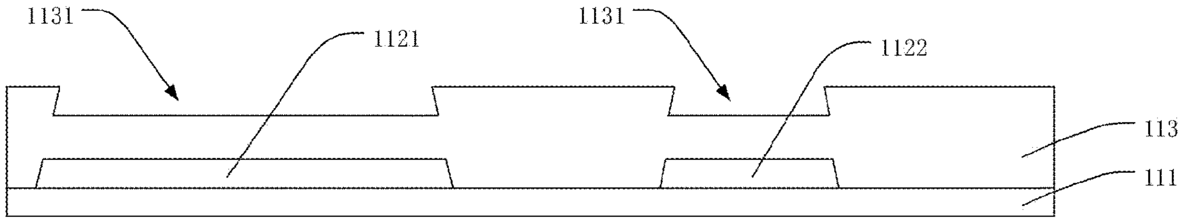
FIG. 13 is a schematic diagram illustrating a layered structure after forming a buffer layer in Step S10 in Embodiment 2 of the present invention.

As shown in FIG. 13, a layer of inorganic material is deposited on the base layer 111 by chemical vapor deposition to form a buffer layer 113. Two first grooves 1131 corresponding to the first light shielding layer 1121 and the second light shielding layer 1122 respectively, are formed in the buffer layer 113 by a wet etching process.

The base layer 111, the first light shielding layer 1121, the second light shielding layer 1122 and the buffer layer 113 are combined to form the substrate layer 110.

Figure 14:
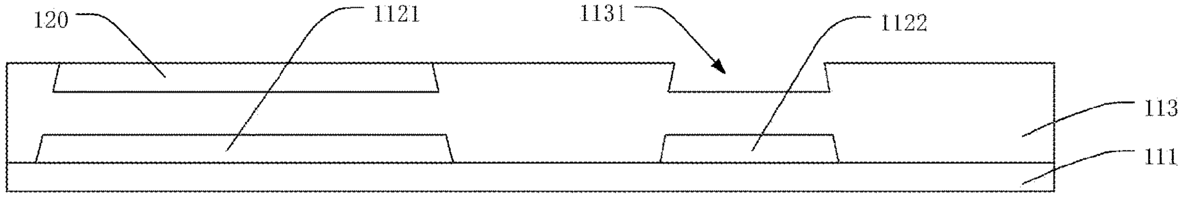
FIG. 14 is a schematic diagram illustrating a layered structure after forming an active layer in Step S20 in Embodiment 2 of the present invention.

Step S22) Form an Active Layer 120:

A layer of semiconductor material is deposited by physical vapor sputtering, and the semiconductor material fills into the first groove 1131 corresponding to the first light shielding layer 1121. The semiconductor material may be metal oxides such as indium tin oxide and indium gallium zinc oxide. The semiconductor material layer is patterned by a photolithography process to form an active layer 120 as shown in FIG. 14. The active layer 120 may use oxalic acid-based chemical solution as an etchant for the patterning.

Figure 15:
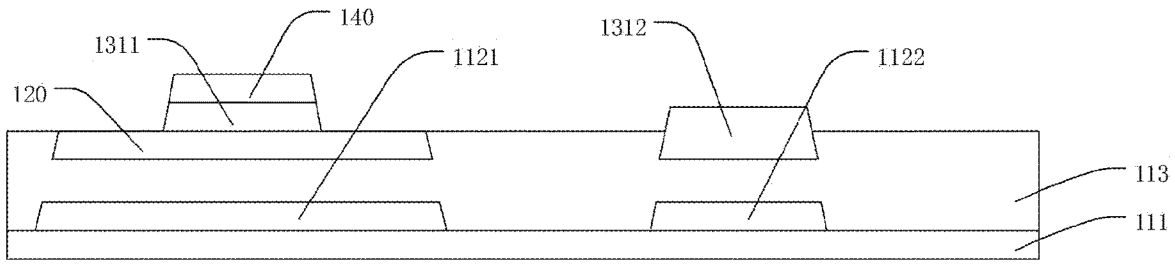
FIG. 15 is a schematic diagram illustrating a layered structure after forming an gate insulating layer and a first conductive layer in Step S30 in Embodiment 2 of the present invention.

Step S23) Form a Gate Insulating Layer 131 and a First Conductive Layer 140:

An inorganic material layer covering the active layer 120 is deposited on the substrate layer 110 by chemical vapor deposition, and the inorganic material layer also fills up the first groove 1131 corresponding to the second light shielding layer 1122. A metal material layer is deposited on a surface of the inorganic material layer away from the active layer 120. The inorganic material layer and the metal material layer are patterned by a photolithography process. As shown in FIG. 15. a first insulating layer 1311 and a second insulating layer 1312 in the gate insulating layer 131 are formed as well as a first conductive layer 140 located on the first insulating layer 1311 is formed. During the patterning of the gate layer 141, the active layer 120 is conductorized by plasma treatment after the photoresist of the gate layer 141 is peeled off.

Figure 16:
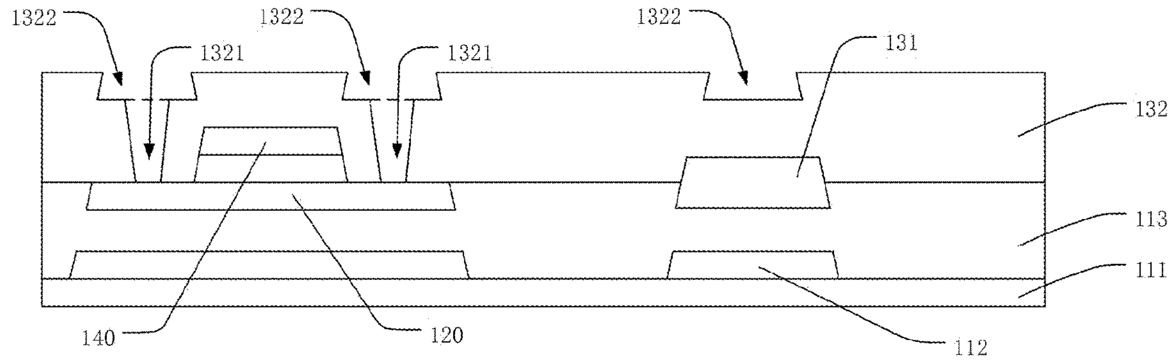
FIG. 16 is a schematic diagram illustrating a layered structure after forming an interlayer dielectric layer in Step S40 in Embodiment 2 of the present invention.

Step S24) Form an Interlayer Dielectric Layer 132, and Form Second Grooves 1322 on the Interlayer Dielectric Layer 132:

A layer of inorganic material is deposited on the substrate layer 110 by chemical vapor deposition to form an interlayer dielectric layer 132. The interlayer dielectric layer 132 is patterned by a grayscale or halftone mask photolithography process. As shown in FIG. 16, a plurality of second grooves 1322 are formed on a surface of the interlayer dielectric layer 132 away from the substrate layer 110. Meanwhile, first connecting holes 1321 penetrating the interlayer dielectric layer 132 are formed in the second groove 1322 corresponding to the active layer 120. The interlayer dielectric layer 132 may be dry-etched using an oxidizing gas such as fluorine.

Figure 17:
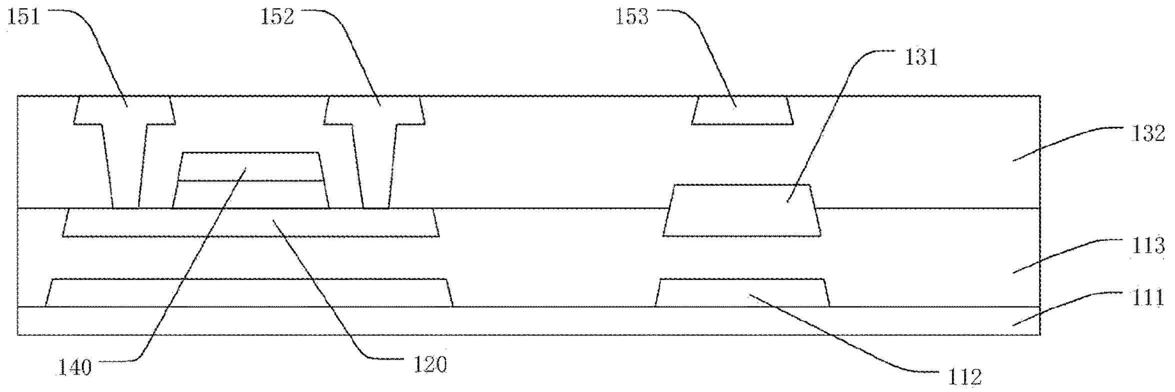
FIG. 17 is a schematic diagram illustrating a layered structure after forming a second conductive layer in Step S50 in Embodiment 2 of the present invention.

Step S25) Form a Second Conductive Layer 150:

A metal material layer filling the second grooves 1322 and the first connecting holes 1321 is deposited on the interlayer dielectric layer 132 by physical vapor deposition, and the metal material layer is a laminated structure of a molybdenum-titanium alloy layer and a copper metal layer. The metal material layer is patterned by a photolithography process. As shown in FIG. 17, a first electrode layer 151, a second electrode layer 152 and a wiring layer 153 are formed in the second conductive layer 150. The second conductive layer 150 can be etched by using hydrogen peroxide-based chemical solution as an etchant for the patterning.

Further, in Step S24, the buffer layer 113 can be patterned by using photolithography process again to form deep holes sequentially penetrating the interlayer dielectric layer 132 and the buffer layer 113, and in Step S25, the metal material is also deposited in the deep holes such that the first electrode layer 151 or the second electrode layer 152 can be electrically connected to the light shielding layer 112, thereby avoiding a floating gate effect caused by the light shielding layer 112.

Furthermore, when a dry etching barrier layer on the light shielding layer 112 is InGaZnO, dry etching plasma should also be used to conductorize the etching barrier layer to ensure charge transferring between the first electrode layer 151 in the second conductive layer 150 and the light shielding layer 112, thereby compensating the threshold voltage (Vth).

Step 26) Form a Passivation Layer 133, a Flat Layer 134, a Pixel Electrode Layer 200 and a Pixel Defining Layer 300:

A passivation layer 133 and a flat layer 134 are formed on the interlayer dielectric layer 132 by deposition. The passivation layer 133 and the flat layer 134 are patterned to form a second connecting hole 135 penetrating the flat layer 134 and the passivation layer 133.

A conductive material filling the second connecting hole 135 is deposited on the flat layer 134, and the layer of conductive material is patterned to form the pixel electrode layer 200.

Figure 18:
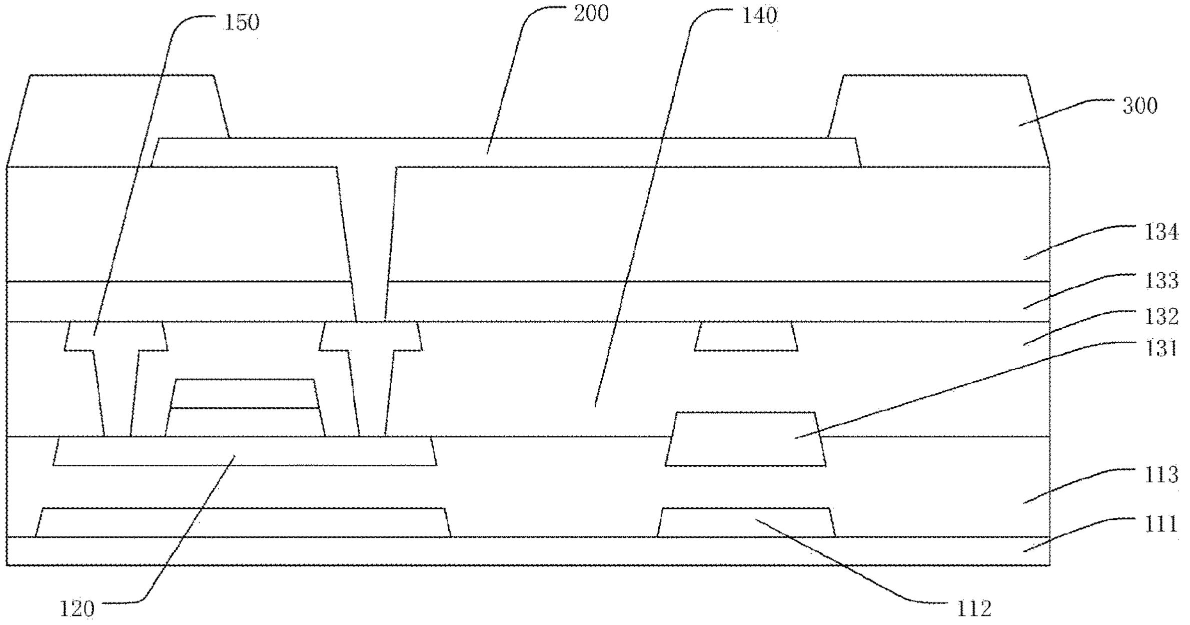
FIG. 18 is a schematic diagram illustrating a layered structure after forming a pixel defining layer in Step S60 in Embodiment 2 of the present invention.

A layer of insulating material is coated on the flat layer 134 and the pixel electrode layer 200 and is patterned to form a pixel defining layer 300 having a plurality of openings, as shown in FIG. 18.

Step S27) Form a Light Emitting Device Layer 400:

Organic material layers, such as a hole injection layer, a hole transport layer and a light emitting layer, are printed in the openings by ink jet printing, and an electron transport layer and an electron injection layer are formed on the light emitting layer by evaporation. Finally, a cathode layer is formed by a sputtering process. The hole injection layer, the hole transport layer, the light emitting layer, the electron transport layer and the electron injection layer are combined to form a light emitting device 410 in the light emitting device layer 400.

In the embodiment of the present invention, the film thickness of protrusions in the array substrate is reduced by the first grooves and the second grooves, and this reduces the level difference between the interlayer dielectric layer and the conductive structures in the second conductive layer. In this way, surface flatness of the array substrate is improved, thereby improving the flatness of the pixel electrode layer manufactured on the surface of the array substrate. Further, the height of the surface of the light emitting device on the pixel electrode layer can also be maintained uniform such that the light emitted by the light emitting device becomes more uniform, thereby improving the luminous efficiency of the light emitting device and improving the brightness of the display panel.

The present disclosure has been described with reference to preferred embodiments, which are only embodiments for illustrating the principle and application of the present disclosure. It should be understood that various modifications and variants to the present disclosure may be made by anyone skilled in the art, without departing from the scope and spirit of the present disclosure. It should be noted that various dependent claims and technical features described herein may be combined with one another in any different manner from the original claims. It should also be understood that the technical features described in view of a single embodiment can also be applied to other embodiments.

What is claimed is:

1. A display panel, comprising:

a light emitting device layer, provided with a plurality of light emitting devices;

an array substrate, the light emitting device layer being disposed on the array substrate;

the array substrate comprising:

a substrate layer;

an insulation module, disposed on the substrate layer;

a first conductive layer and a second conductive layer, disposed in the insulation module at different layers, the first conductive layer being located at a side of the second conductive layer close to the substrate layer;

wherein the first conductive layer comprises pad layers, and orthographic projections of the pad layers and the second conductive layer on the substrate layer are non-overlapped;

wherein the second conductive layer comprises:

a first electrode layer;

a second electrode layer, located at a side of the first electrode layer;

a wiring layer, located at a side of the second electrode layer away from the first electrode layer;

wherein the first electrode layer, the second electrode layer and the wiring layer are located on a same plane in the insulation module and are electrically insulated from each other;

wherein the orthographic projections of the pad layers on the substrate layer are located at two sides of the wiring layer.

2. A method for manufacturing a display panel, comprising steps of:

preparing a substrate layer;

manufacturing a first conductive layer, a second conductive layer and an insulation module on the substrate layer to form an array substrate;

manufacturing a plurality of light emitting devices on the array substrate to form a light emitting device layer;

after preparing the substrate layer, the method further comprising steps of:

forming first grooves on the substrate layer, wherein orthographic projections of the first grooves and the second conductive layer on the substrate layer are overlapped;

wherein the step of preparing the substrate layer comprises:

forming a light shielding layer on a base layer;

forming a buffer layer covering the light shielding layer on the base layer;

forming the first grooves on a surface of the buffer layer away from the light shielding layer;

after the step of preparing the substrate layer, the method further comprising:

forming an active layer in the first grooves.

3. The method of claim 2, wherein a depth of each of the first grooves is less than or equal to a thickness of the active layer.

4. The method of claim 2, wherein the step of manufacturing the first conductive layer, the second conductive layer and the insulation module on the substrate layer comprises steps of:

forming a gate insulating layer on the substrate layer;

forming the first conductive layer on the gate insulating layer;

forming an interlayer dielectric layer covering the gate insulating layer and the first conductive layer on the substrate layer;

forming the second conductive layer on the interlayer dielectric layer;

forming a passivation layer covering the second conductive layer on the interlayer dielectric layer;

forming a flat layer on the passivation layer;

after the step of forming the interlayer dielectric layer on the substrate layer, the method further comprises:

forming second grooves on a surface of the interlayer dielectric layer facing the second conductive layer, and forming the second conductive layer in the second grooves.

5. The method of claim 4, wherein the gate insulating layer comprises:

a first insulating layer, disposed on a surface of the active layer of the array substrate away from the substrate layer;

a second insulating layer, disposed on the substrate layer and corresponding to the wiring layer in the second conductive layer;

wherein the second insulating layer is disposed in one of the first grooves;

wherein the first conductive layer further comprises a gate layer, and the gate layer is disposed on a surface of the first insulating layer away from the active layer.

6. A display panel, comprising:

a light emitting device layer, provided with a plurality of light emitting devices;

an array substrate, the light emitting device layer being disposed on the array substrate;

the array substrate comprising:

a substrate layer;

an insulation module, disposed on the substrate layer;

a first conductive layer and a second conductive layer, disposed in the insulation module at different layers, the first conductive layer being located at a side of the second conductive layer close to the substrate layer;

wherein first grooves are provided on a surface of the substrate layer facing the insulation module, and orthographic projections of the first grooves and the second conductive layer on the substrate layer are overlapped;

wherein the substrate layer comprises:

a base layer:

a light shielding layer, disposed on the base layer;

a buffer layer, disposed on the base layer and covering the light shielding layer;

wherein the first grooves are provided on a surface of the buffer layer away from the light shielding layer;

wherein an active layer of the array substrate is disposed in the first grooves.

7. The display panel of claim 6, wherein a depth of each of the first grooves is less than or equal to a thickness of the active layer.

8. The display panel of claim 6, wherein the insulation module comprises:

a gate insulating layer, disposed on the substrate layer, the first conductive layer being disposed on a surface of the gate insulating layer away from the active layer of the array substrate;

an interlayer dielectric layer, disposed on the substrate layer and covering the gate insulating layer and the first conductive layer, the second conductive layer being disposed at a side of the interlayer dielectric layer away from the first conductive layer;

a passivation layer, disposed on the interlayer dielectric layer and covering the second conductive layer;

a flat layer, disposed on the passivation layer;

wherein second grooves are provided on a surface of the interlayer dielectric layer facing the second conductive layer, and the second conductive layer is located in the second grooves.

9. The display panel of claim 8, wherein the gate insulating layer comprises:

a first insulating layer, disposed on a surface of the active layer of the array substrate away from the substrate layer;

a second insulating layer, disposed on the substrate layer and corresponding to a wiring layer in the second conductive layer;

wherein the second insulating layer is disposed in one of the first grooves;

wherein the first conductive layer further comprises a gate layer, and the gate layer is disposed on a surface of the first insulating layer away from the active layer.

10. A display device, comprising the display panel of claim 6.

11. The display device of claim 10, wherein a depth of each of the first grooves is less than or equal to a thickness of the active layer.

12. The display device of claim 10, wherein the insulation module comprises:

a gate insulating layer, disposed on the substrate layer, the first conductive layer being disposed on a surface of the gate insulating layer away from an active layer of the array substrate;

an interlayer dielectric layer, disposed on the substrate layer and covering the gate insulating layer and the first conductive layer, the second conductive layer being disposed at a side of the interlayer dielectric layer away from the first conductive layer;

a passivation layer, disposed on the interlayer dielectric layer and covering the second conductive layer;

a flat layer, disposed on the passivation layer;

wherein second grooves are provided on a surface of the interlayer dielectric layer facing the second conductive layer, and the second conductive layer is located in the second grooves.

13. The display device of claim 12, wherein the gate insulating layer comprises:

a first insulating layer, disposed on a surface of the active layer of the array substrate away from the substrate layer;

a second insulating layer, disposed on the substrate layer and corresponding to a wiring layer in the second conductive layer;

wherein the second insulating layer is disposed in one of the first grooves;

wherein the first conductive layer further comprises a gate layer, and the gate layer is disposed on a surface of the first insulating layer away from the active layer.

* * * * *